United States Patent
O'Brien, III et al.

(10) Patent No.: US 11,061,814 B1
(45) Date of Patent: Jul. 13, 2021

(54) MANAGING DATA STORAGE CACHING AND TIERING

(71) Applicant: EMC Corporation, Hopkinton, MA (US)

(72) Inventors: Walter A. O'Brien, III, Westborough, MA (US); Thomas E. Linnell, Northborough, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 14/039,463

(22) Filed: Sep. 27, 2013

Related U.S. Application Data

(60) Provisional application No. 61/800,724, filed on Mar. 15, 2013.

(51) Int. Cl.
*G06F 12/02* (2006.01)
*G06F 3/06* (2006.01)

(52) U.S. Cl.
CPC ........ *G06F 12/0246* (2013.01); *G06F 3/0631* (2013.01); *G06F 2212/7211* (2013.01); *G11C 2211/5641* (2013.01)

(58) Field of Classification Search
CPC ............. G06F 2206/1012; G06F 3/061; G06F 3/0613; G06F 2212/7211; G06F 12/0246; G06F 3/0631; G06F 3/0644; G06F 3/0647; G06F 3/0665; G06F 2212/7204; G11C 16/349; G11C 16/3495; G11C 2211/5641
See application file for complete search history.

(56) References Cited

U.S. PATENT DOCUMENTS

| | | | | |
|---|---|---|---|---|
| 7,970,919 B1 * | 6/2011 | Duran | ............ | G06F 3/0616 709/200 |
| 8,429,346 B1 * | 4/2013 | Chen | ............ | G06F 3/0689 709/213 |
| 2010/0287328 A1 * | 11/2010 | Feldman | ............ | G06F 12/0246 711/103 |
| 2011/0302477 A1 * | 12/2011 | Goss | ............ | G06F 11/1068 714/773 |
| 2013/0346676 A1 * | 12/2013 | Kim | ............ | G06F 12/0246 711/103 |

* cited by examiner

*Primary Examiner* — Ernest Unelus
(74) *Attorney, Agent, or Firm* — Krishnendu Gupta; Deepika Bhayana; Dorothy Wu Chiang

(57) ABSTRACT

There is disclosed a technique for use in managing data storage in a data storage system. A first metric indicative of a specified wear rate for a flash drive is determined where the flash drive has a first portion allocated as logical space and a second portion allocated as over-provisioning space. An allocation ratio indicative of the ratio between the first portion and the second portion is determined. The allocation ration is dynamically adjusted to cause the current wear rate to change.

18 Claims, 6 Drawing Sheets

MANAGING DATA STORAGE CACHING AND TIERING

RELATED APPLICATIONS

This application claims the benefit of U.S. Provisional Application No. 61/800,724, filed Mar. 15, 2013, entitled MANAGING DATA STORAGE CACHING AND TIERING, which is incorporated herein by reference in its entirety.

TECHNICAL FIELD

The present invention relates to managing data storage caching and tiering.

BACKGROUND OF THE INVENTION

Storage devices are employed to store data that are accessed by computer systems. Examples of basic storage devices include volatile and non-volatile memory, floppy drives, hard disk drives, tape drives, and optical drives. A storage device may be locally attached to an input/output (I/O) channel of a computer. For example, a hard disk drive may be connected to a computer's disk controller. A storage device may also be accessible over a network. Examples of such storage devices include network attached storage (NAS) and storage area network (SAN) devices. A storage device may be a single stand-alone component or be comprised of a system of storage devices such as in the case of Redundant Array of Inexpensive Disks (RAID) groups.

A traditional RAID group is a collection of hard disk drives operating together logically as a unified storage device, e.g., to provide some data protection through redundancy. Storage devices with RAID groups are designed to store large quantities of data and typically include one or more storage array processors (SPs), for handling both requests for allocation and I/O requests.

Many computing devices now include non-volatile memory (NVM), such as certain magnetic, semiconductor, and/or optical storage media, and may include removable disk systems, hard drives, and other storage media systems allowing the device and/or a user to store data the device uses or is directed to use. The characteristics of non-volatile, vibration-free, small size, and low power consumption have made a type of NVM known as flash memory an excellent component to be utilized in various storage systems. Flash storage devices are widely used as memory storage for computers and consumer system products such as a notebook, desktop computer, set top box, digital camera, mobile phone, PDA and GPS. The increasing demand for more storage in these products has driven the need to expand the capacity of flash storage devices.

Flash memory may also be used in one or more multiple locations in a computer system. For example, computer systems may include different flash memory based resources used by one or more host processors. Such resources and host processors in a computer system may be interconnected by one or more communication connections. These flash memory based resources may include, for example, data storage devices such as those included in the data storage systems manufactured by EMC Corporation. These data storage systems may be coupled to one or more servers or host processors (also known as hosts) and provide storage services to each host processor. Multiple data storage systems from one or more different vendors may be connected and may provide common data storage for one or more host processors in a computer system.

There are at least two types of flash storage devices. A first type has a pre-defined mechanical dimension. This type includes: (a) Secure Digital (SD) card, (b) Multi Media Card (MMC), (c) Memory Stick (MS) card, (d) Compact Flash (CF) card, (e) Express Flash card, (f) Serial Advanced Technology Attachment (ATA) Flash disk, and (g) Small Computer System Interface (SCSI) Flash disk.

A second type of flash storage devices has no pre-defined physical dimension, which includes universal serial bus flash disk (USB), Disk On Module (DOM), and MP3 players. However, based upon the need for the system compactness, it is generally desirable to make this type of flash storage device as small in size and as high in capacity as possible.

Advances in semiconductor technology have lead to an increase in the use of semiconductor solid state drives (also known as solid state disks or SSDs), which may use flash memory as a storage device, in areas such as computer systems. Thus, in at least some cases there may be a trend towards the use of SSDs as storage devices instead of, or in addition to, magnetic disks.

An SSD has many features that can make it an attractive storage device. For example, SSDs have a fast access rate, high throughput, a high integration density, and stability against an external impact. SSDs can move large amounts of data and process a large number of I/O requests. This allows users to complete data transactions much more quickly.

Furthermore, advances in manufacturing technologies for SSDs may reduce the production costs of SSDs and also increase the storage capacities of SSDs. These developments may provide incentive to use SSDs in place of or in conjunction with magnetic disks in at least some cases.

A flash memory die is the basic element of flash memory. A typical flash memory chip comprises a flash memory die mounted on a substrate within an enclosure and the electrical signals are bonded out to the metal contacts of the package. Two popular package types for flash memory chips are WSOP (Very Very Thin Small Out-line Package) and BGA (Ball Grid Array).

A flash memory die is composed of a number of cells that are used to store data. For instance, a single cell may store one, two, or more bits of data, depending on the design. Cells may be organized into one or more pages and pages may be grouped together to form blocks. For example, a page may contain four kilobytes (KB) of data and a block may contain 128 pages or 512 KBs of data.

SUMMARY OF THE INVENTION

There is disclosed a technique for use in managing data storage in a data storage system. A first metric indicative of a specified wear rate for a flash drive is determined where the flash drive has a first portion allocated as logical space and a second portion allocated as over-provisioning space. An allocation ratio indicative of the ratio between the first portion and the second portion is determined. The allocation ration is dynamically adjusted to cause the current wear rate to change.

BRIEF DESCRIPTION OF THE DRAWINGS

Features and advantages of the present invention will become more apparent from the following detailed description of exemplary embodiments thereof taken in conjunction with the accompanying drawings in which.

DETAILED DESCRIPTION

Figure 1:
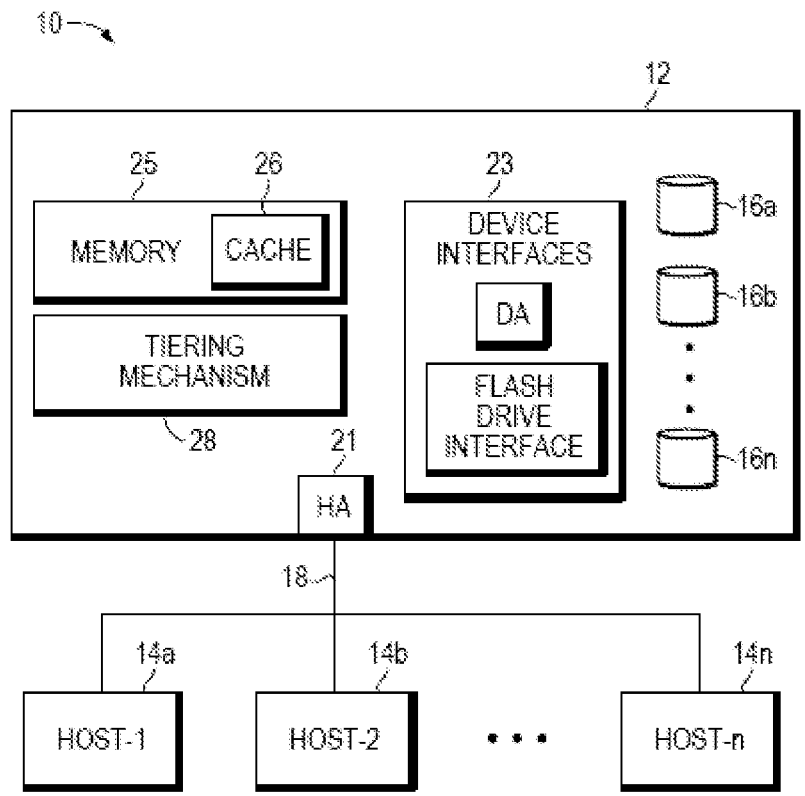
FIG. 1 is an example of a system that may utilize the technique described herein comprising a data storage system connected to host systems through a communication medium.

Data storage systems may include different types of storage devices, such as Flash drives and hard disk drives. Flash drives are typically specified as having an expected lifetime (e.g., as measured in an amount of actual elapsed time such as a number of years or months) based on a number of guaranteed write cycles at a particular rate or frequency at which the writes are performed. Thus, a flash drive may have a specified lifetime rating expressed in calendar or wall clock elapsed time based on the amount of time it takes to perform the number of guaranteed write cycles. SSDs comprising flash memory devices may be referred to herein as flash drives; however SSDs may employ other memory technology such as nonvolatile Random Access Memory (NRAM) and the like.

An SSD may be specified as having a physical size and a logical size. The physical size (also referred to herein as "physical space") or capacity represents the total amount of memory available on the device. The logical size (also referred to herein as "logical space") is the amount memory allocated to a user for storing user data. The remaining amount of space is reserved for data management processes, and may be referred to herein as over-provisioning. For example, physical size may be 256 GB and the logical size may be 200 GB. The remaining 56 GB may be reserved for over-provisioning. In conventional systems, a user may chose an SSD having a particular amount of space reserved for over-provisioning based upon the system design criteria; however, over-provisioning is a static value that cannot be increased or decreased.

Logical to physical size is typically chosen such that the SSD can meet a particular specification, such as a rated lifetime specification based on an expected rate at which the writes will be performed. The allocation of over-provisioning space to logical space may be expressed as a ratio and varies based on intended application taking into account desired endurance and performance characteristics (as used herein, such ratio may be referred to as "over-provisioning ratio" or "allocation ratio"). For example, over-provisioning values may vary from as low as 2-5% for inexpensive consumer applications to upwards of 60-70% for high-performance MLC flash enterprise applications.

Writing data often requires more write operations than the amount of data being written. The number of extra writes required to perform the intended writes may be referred to as write amplification. For example, a 1 MB write may ultimately require 2 MB of actual writes: 1 MB for garbage collection purposes and 1 MB for the actual write request. Thus, in this example, write amplification would be 1:1. The amount of space allocated to over-provisioning can have a significant impact on the write amplification factor, and can vary from slightly more than 1 to 10 times or more.

Increasing the amount of over-provisioning space and/or decreasing the logical size decreases the number of writes required by garbage collection processes as well as reducing write amplification. However, the relationship between over-provisioning and data management work factor is nonlinear. That is, the more over-provisioning space provided, the more the work function decreases; in other words, as over-provisioning increases, the work function decreases at an even higher rate. Conversely, small amount of over-provisioning space will significantly increase the work function.

A flash drive can be queried to determine the drive's effective write rate. Wear rate may be monitored based upon a particular implementation criteria. For instance, wear rates may be monitored hourly, daily, weekly, or monthly as desired based upon operating demand placed on the system. For example, querying a flash drive indicates that it's been written to 10K times after one month of operation. If writes continue at the same rate, the flash drive will be written to 120 K times per year. After five years, a common warranty period, the flash drive will be written to 600 K times. If the flash drive is warranted for say 500 K writes, the flash drive can be expected to fail in less than 5 years which would be within the warranty period, resulting in increased maintenance costs and a dissatisfied customer.

Advantageously, techniques described herein disclose a method to reduce the amount of space allocated for capacity. As a result, less data will be written to the flash drive and write amplification will be reduced thereby reducing the number of writes directed to the flash drive and, consequently, increasing the lifetime.

Conversely, if the method determines that writes are being performed at a much lower rate, say 1K per month, or 12 K per year. If the drive is rated for 500 K writes over its lifetime, and writes continue at this rate, the drive may last over 40 years. In this case, the amount of memory allocated for logical space may be increased, thereby, increasing the rate at which writes are directed to the flash drive. As a result, performance is improved.

Consequently, employing techniques described herein may be used to increase and/or decrease the wear rate for a particular flash drive to control wear rate and improve potential system performance. In this case, the technique may be used to monitor the rate at which writes are directed to a flash drive and if it is determined that the rate is high enough such that the drive may be expected to fail sooner than expected, logical space can be decreased to slow the number of writes directed to the drive and in create the relative amount of over-provisioning space available for data management and storage operations. As a result, the method will slow the rate at which the flash drive wears. If it is determined that the writes are so low such that the expected lifetime of the drive is significantly beyond the intended use, and performance may be improved by increasing the number of writes directed to the flash drive. By continuously monitoring the rate, the amount of memory allocated for logical space may be increased or decreased in order to tailor the wear rate so as to ensure the flash drive lasts as long as intended while providing maximum performance during its lifetime.

Advantageously, the techniques can allow a data storage system to tune the SSD wear rate and performance to a particular workload by dynamically adjusting the wear rate as workloads change. Such changes may occur over time.

For example, workloads may increase when the system is first put into production. As applications and data are loaded onto the system and as the system ramps up, it stores more and more data thereby approaching capacity. In this case, it may be desirable to reduce or slow the rate at which data is written to the system. Alternatively, workloads may decrease as new systems are installed. Applications and data may be moved from one or more existing system onto the new system thereby decreasing workloads on the existing system. As the storage system reaches end-of-life applications may continue to be migrated elsewhere thus reducing the wear rate and, in this case, memory allocated for capacity may be increased to provide additional performance boost. In other words, SSDs come with a fixed ratio of logical space to over-provisioning space that implies a particular endurance profile. By dynamically changing the ratio the endurance profile can be changed.

Referring to FIG. 1, shown is an example of an embodiment of a system that may be used in connection with performing one or more implementations of the current techniques described herein. The system 10 includes a data storage system 12 connected to host systems 14a-14n through communication medium 18. In this embodiment of the computer system 10, the n hosts 14a-14n may access the data storage system 12, for example, in performing input/output (I/O) operations or data requests. The communication medium 18 may be any one or more of a variety of networks or other type of communication connections as known to those skilled in the art. The communication medium 18 may be a network connection, bus, and/or other type of data link, such as a hardwire, wireless, or other connections known in the art. For example, the communication medium 18 may be the Internet, an intranet, network (including a Storage Area Network (SAN)) or other wireless or other hardwired connection(s) by which the host systems 14a-14n may access and communicate with the data storage system 12, and may also communicate with other components included in the system 10.

Each of the host systems 14a-14n and the data storage system 12 included in the system 10 may be connected to the communication medium 18 by any one of a variety of connections as may be provided and supported in accordance with the type of communication medium 18. The processors included in the host computer systems 14a-14n may be any one of a variety of proprietary or commercially available single or multi-processor system, such as an Intel-based processor, or other type of commercially available processor able to support traffic in accordance with each particular embodiment and application.

It should be noted that the particular examples of the hardware and software that may be included in the data storage system 12 are described herein in more detail, and may vary with each particular embodiment. Each of the host computers 14a-14n and data storage system may all be located at the same physical site, or, alternatively, may also be located in different physical locations. The communication medium that may be used to provide the different types of connections between the host computer systems and the data storage system of the system 10 may use a variety of different communication protocols such as SCSI, Fibre Channel, PCIe, iSCSI, NFS, and the like. Some or all of the connections by which the hosts and data storage system may be connected to the communication medium may pass through other communication devices, such as a Connectrix or other switching equipment that may exist such as a phone line, a repeater, a multiplexer or even a satellite.

Each of the host computer systems may perform different types of data operations in accordance with different types of tasks. In the embodiment of FIG. 1, any one of the host computers 14a-14n may issue a data request to the data storage system 12 to perform a data operation. For example, an application executing on one of the host computers 14a-14n may perform a read or write operation resulting in one or more data requests to the data storage system 12.

It should be noted that although element 12 is illustrated as a single data storage system, such as a single data storage array, element 12 may also represent, for example, multiple data storage arrays alone, or in combination with, other data storage devices, systems, appliances, and/or components having suitable connectivity, such as in a SAN, in an embodiment using the techniques herein. It should also be noted that an embodiment may include data storage arrays or other components from one or more vendors. In subsequent examples illustrating the techniques herein, reference may be made to a single data storage array by a vendor, such as by EMC Corporation of Hopkinton, Mass. However, the techniques described herein are applicable for use with other data storage arrays by other vendors and with other components than as described herein for purposes of example.

The data storage system 12 may be a data storage array including a plurality of data storage devices 16a-16n. The data storage devices 16a-16n may include one or more types of data storage devices such as, for example, one or more disk drives and/or one or more solid state drives (SSDs). An SSD is a data storage device that uses solid-state memory to store persistent data. An SSD using SRAM or DRAM, rather than flash memory, may also be referred to as a RAM drive. SSD may refer to solid state electronics devices as distinguished from electromechanical devices, such as hard drives, having moving parts. Flash memory-based SSDs (also referred to herein as "flash disk drives," "flash storage drives", or "flash drives") are one type of SSD that contains no moving parts.

The particular data storage system as described in this embodiment, or a particular device thereof, such as a disk or particular aspects of a flash device, should not be construed as a limitation. Other types of commercially available data storage systems, as well as processors and hardware controlling access to these particular devices, may also be included in an embodiment. Furthermore, the data storage devices 16a-16n may be connected to one or more controllers (not shown). The controllers may include storage devices associated with the controllers. Communications between the controllers may be conducted via inter-controller connections. Thus, the current techniques described herein may be implemented in conjunction with data storage devices that can be directly connected or indirectly connected through another controller.

Host systems provide data and access control information through channels to the storage systems, and the storage systems may also provide data to the host systems also through the channels. The host systems do not need to address the drives or devices 16a-16n of the storage systems directly, but rather access to data may be provided to one or more host systems from what the host systems view as a plurality of logical devices or logical units (LU). The LUs may or may not correspond to the actual physical devices or drives 16a-16n. For example, one or more LUs may reside on a single physical drive or multiple drives, or a variety of subsets of multiple drives. Data in a single data storage system, such as a single data storage array, may be accessed by multiple hosts allowing the hosts to share the data residing therein.

A map kept by the storage array may associate logical addresses in the host visible LUs with the physical device addresses where the data actually is stored. The map also contains a list of unused slices on the physical devices that are candidates for use when LUs are created or when they expand. The map in some embodiments may also contains other information such as time last access for all or a subset of the slices or frequency counters for the slice; the time last access or frequency counters. This information can be analyzed to derive a temperature of the slices which can indicate the activity level of data at the slice level.

The map, or another similar map, may also be used to store information related to write activity (e.g., erase count) for multiple drives in the storage array. This information can be used to identify drives having high write related wear relative to other drives having a relatively low write related wear.

The data storage system 12 in the embodiment of FIG. 1 further comprises a host adaptor (HA) 21 coupled to the hosts 14a-14n via the communication medium 18, device interfaces 23, memory 25, cache 26, and tiering mechanism 28. The device interfaces 23 may comprise device adaptors and interfaces (e.g., a flash drive interface). Additionally, the cache 26 may be connectable to the device interfaces 23 if the cache utilizes flash drives in addition to memory.

As described above, the data storage system 12 may be a data storage array including a plurality of data storage devices 16a-16n in which one or more of the devices 16a-16n are flash memory devices employing one or more different flash memory technologies. In one embodiment, the data storage system 12 may be a VMAX® data storage array and/or VNX® data storage array by EMC Corporation of Hopkinton, Mass. In the foregoing data storage array, the data storage devices 16a-16n may include a combination of disk devices and SSD, such as flash devices, in which the flash devices may appear as standard Fibre Channel (FC) drives to the various software tools used in connection with the data storage array. The disk devices may be any one or more different types of disk devices such as, for example, an ATA disk drive, FC disk drive, and the like.

The flash devices may be constructed using different types of memory technologies such as nonvolatile semiconductor NAND flash memory forming one or more single level cell (SLC) devices and/or multi level cell (MLC) devices. Additionally, flash memory devices and disk devices are two example types of devices that may be included in a data storage system used in connection with the techniques described herein. Although various example embodiments herein describe flash cache in the context of SLC and MLC flash devices, this is by way of illustration only and should not be construed as being limited as such. For example, other solid state devices such as phase change memory (PCM), single MLC (SMLC), and the like may be similarly implemented as flash cache.

Thus, the storage system may include a variety of storage devices with different physical and performance characteristics (e.g., types of storage devices, disk speed such as in RPMs), RAID levels and configurations, different replication services (such as particular software used in the data storage system providing data replication), allocation of cache, and processors used to service an I/O request. Storage devices with the same or similar characteristics may be grouped into two or more tiers. For example, a group of solid state drives may comprise a fastest tier, a group of fast but small disks may comprise a fast tier, and a group of slow but large disks may comprise a slow tier. It should be noted that in addition to a storage tier, there may be a construct referred to as a storage pool. A storage pool ("pool") may be a reserve of storage devices that may be used, for example, to create LUs, as needed. A pool, as in the case of a storage tier, may be made up of devices with different performance and cost characteristics. Thus, devices within a pool may be partitioned into two or more tiers. In some embodiments, each pool may itself represent a tier. In this embodiment, a pool may be made up of only storage devices with the same or similar characteristics.

In some embodiments, it may also be possible to bind or designate a set of data storage resources, such as logical and/or physical devices, a portion of cache 26, and services, such as a software vendor's service for providing data replication, to one or more of the tiers. The set of resources associated with or designated for use by a tier or grouping within a pool may be characterized as a dynamic binding in that the particular set of data storage system resources associated with a tier may vary from time to time. This binding or association of logical to physical may be kept by making or updating entries in the map. Also, the configuration for the data storage system, aspects of the current data storage system resources (e.g., types of devices, device storage capacity and physical device characteristics related to speed and time to access data stored on the device), and current workload and other dynamic aspects (e.g., actual observed performance and utilization metrics) of the data storage system, may also change over time.

The flash drives may be individually optimized for write longevity via wear leveling. Wear leveling may be characterized as a technique that attempts to arrange or store data on a flash drive where erasures and rewrites are evenly distributed so that no single cell prematurely fails due to a high concentration of writes. Additionally, a data storage array may utilize some techniques in connection with flash drives, other SSDs, and also disks. For example, bad blocks, or other portions of a drive may be mapped out so that once discovered, they are not subsequently used for storing data. Techniques such as wear leveling and mapping out bad blocks or other bad data portions may be used in combination with the techniques described herein in following paragraphs for flash drives to further optimize write longevity.

The techniques herein may be generally used in connection with any type of flash drive in order to ensure that the flash drive lasts a specified lifetime. The flash drive may be, for example, a flash drive which is a NAND gate flash device, NOR gate flash device, flash device that uses SLC or MLC technology. Although various example embodiments herein describe flash cache in the singular, flash cache may be arranged or configures as multiple sub-caches.

Figure 2:
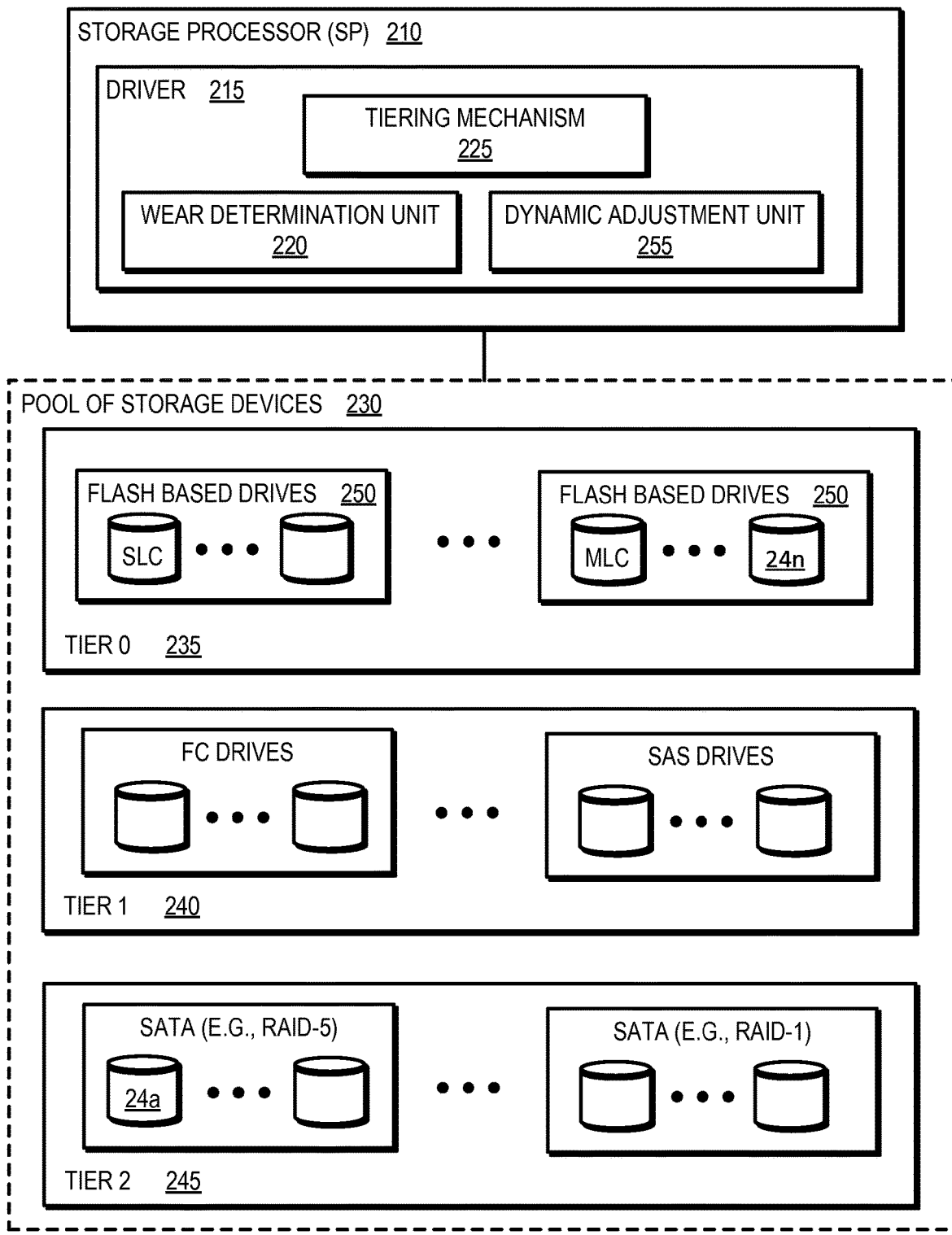
FIG. 2 is a block diagram illustrating an example embodiment in additional detail that may utilize the techniques described herein.

Referring to FIG. 2, shown is a more detailed representation of components that may be included in an example embodiment using the techniques described herein. In the example, a data storage system 12 may include a pool of storage devices that includes a variety of disks 24a-n accessed by logical volumes as described above. The data storage system 12 may also include storage processing circuitry 210 having a driver 215 that operates in accordance with and/or helps implement a wear determination unit 220, a tiering mechanism 225, and a dynamic adjustment unit 255. The driver 215 may be part of, work in conjunction with, or independent of the wear determination unit 220 and/or the dynamic adjustment unit 255. As described in more detail herein, one or more of the disks 24 may be, include, or be included in an SSD drive.

The pool storage devices 230 include a number of different types of storage devices having different performance/ cost characteristics. The storage devices can be grouped together with like type devices to form a particular RAID configuration (e.g., RAID-5, RAID-1, etc.). The RAID groups may be designated as belonging to one of multiple tiers 235, 240, 245, where the tiers are categorized according to their corresponding performance characteristics. For example, tier 0 235, comprising SSD drives, may be the highest performing tier, tier 1 240, comprising FC and/or SAS drives, may be the next highest performing tier, and tier 2 245, comprising SATA drives, may be a lower performing tier. It should be noted that, different RAID group types can be group together in the same tier. For example, tier 2 may include RAID-1, RAID-5, RAID-6, and RAID-10 configurations.

Writing to a flash drive, such as one using SLC technology, includes performing a first operation to erase any existing data and then a second operation to write the new data to be stored. Although descriptions herein may be made to performing a write operation to the flash drive for purposes of simplification, it will be appreciated that performing write operations to flash drives as described herein implies performing both the necessary erasure operation and write operation for writing data to the flash drive. The erase and write operation may be performed relatively close in time, or may be separated in time, or the write may be performed first and an erase subsequent to the write. Additionally, in connection with the foregoing, for examples described herein regarding flash drives, wear out or usage may be expressed as being dependent on a number of write operations performed although the wear out or usage is actually caused by performing the implied erasure operation in order to effect the subsequent write operation to record or write new data to the flash drive (also referred to as a program/erase (P/E) cycle). Furthermore, as noted above, a write operation may include multiple P/E cycles due to write amplification. Thus, descriptions herein for flash drives referring to wear out or usage based on a number of write operations implies the wear out or usage in accordance with the implied erasure operation necessary to affect the subsequent writing of the new data including additional P/E cycles due to write amplification. In connection with obtaining a measurement regarding wear rate, the number of erasures or write operations may be used interchangeably.

Continuing with FIG. 2, the wear determination unit 220 may be configured to determine a wear indicator or metric for an SSD drive by monitoring the erasure count for the drive. This information may be obtained and/or stored in a wear indicator map maintained by the SP 210. An embodiment may collect statistics on a number of writes to a drive by, for example, counting the number of erasures performed on the drive. This may be performed continuously, periodically, aperiodically, over a particular span of time, event based, application based, or other such criteria. The foregoing information may then be used to compute statistics regarding a total number of times, as well as at what rate and how frequently, a drive is written to based on the particular criteria. Flash drives typically have a specified lifetime rating based on the total number of writes. A ratio may be derived using a drive's current number of write cycles and its total rated write count to calculate the percentage of writes performed, which may be viewed as a write utilization metric that may be expressed as a percentage, for example. This information can be analyzed to identify flash drives that may be in danger of failing sooner than expected if the determined write utilization or wear rate continues at the current rate.

The tiering mechanism 225 may be configured to migrate data to the most appropriate tier based on a metric such as temperature. Temperature for a data object (e.g., data slice) can be determined based on the data's activity, i.e., how often the data is accessed. Thus, hot data may be migrated to faster storage (e.g., flash drive), cold data is migrated to slower storage (e.g., hard disk drive), and warm data may be migrated to either faster or slower storage, depending on, for example, the warm data's absolute temperature and available storage space within the available tiers. Migration may be accomplished by copying the data and changing the map entries for the logical addresses that were involved to reflect the new logical to physical association.

In one example embodiment, the dynamic adjustment unit 255 may be configured to dynamically adjust the logical space allocated for user storage in the flash based drive 250. If the wear determination unit 220 determines that the current wear rate for the flash based drive 250 exceeds a particular value, such as its specified wear rate, the dynamic adjustment unit 255 may dynamically reduce the amount of allocated logical space in the flash based drives 250 such that less data will be written to the flash based drive 250. Because the amount of data being written to the flash based drives 250 decreases, the wear rate of the flash based drives 250 decreases as well.

Consequently, the wear rate may effectively be dynamically adjusted in that the logical space may be dynamically decreased or increased. As such, techniques described herein allow balancing flash drive expected lifetime operation against maximizing system performance. In this way, decreasing wear rate can extend the lifetime rating of flash drives at the expense of effectively reducing available flash drive storage. Conversely, the wear rate may be increased to provide additional storage thereby improving performance benefits if it is determined that the current wear rate is below the specified wear rate. Accordingly, the wear rate may be continuously monitored and dynamically adjusted by increasing or decreasing the flash based drives' 250 logical space and/or over-provisioning space as often as desired or necessary.

Alternatively, or in addition, the over-provisioning space may be increased or decreased in a similar manner as that described above in conjunction with the logical space. That is, a sub-section of the over-provisioning space may be targeted for deallocation, data moved off the targeted sub-section, and the sub-section marked or designated as unavailable for subsequent over-provisioning related operations. In other alternative embodiments, the logical space and over-provisioning space may be increased or decreased in a corresponding fashion. For example, when logical space is decreased, the over-provisioning space may remain as is or may be increased by an amount up to the amount that the logical space was decreased by. Similarly, when logical space is increased, over-provisioning space may remain as is (e.g., in the case where logical space was previously decreased and is being increased or reallocated to reclaim previously deallocated space) or decreased as appropriate.

In alternative embodiments, techniques described herein may include one or more additional steps or actions to coordinate dynamically adjusting logical space and/or over-provisioning with storage tiering operations in the data storage system 12. For example, prior to decreasing the logical space on the flash based drives 250, the tiering mechanism 225 may initiate migration of data off the flash based drives 250 to other storage such as another flash drive or HDD on the same of different storage tier or to another flash drive. LBAs corresponding with the decreased logical space will also be subsequently marked as unavailable storage space. Conversely, when dynamically increasing the logical space on the flash based drives 250, the tiering mechanism 225 marks the new LBAs corresponding with the increased logical space as available for storing data associated with subsequent P/E cycles.

By contrast, with conventional systems, the ratio of physical size to logical space is a fixed parameter and is not adjustable by the user. As such, the wear rate cannot be dynamically increased or decreased. As a result, if a particular flash based drive is experiencing excessively high wear rates, the drive will fail sooner than expected, such as before the warranted design life. In such conventional systems, this can result in drive failure, increased customer dissatisfaction, and increased manufacturer maintenance costs due to having to replace devices that fail within the manufacturer's warranty period. Similarly, if the flash drive is experiencing a wear rate significantly below its specified wear rate, the flash drive may not operate at maximum performance.

Conventionally, it is possible for a drive maker, in at least some cases, to increase (e.g., double) the amount of memory in a drive to provide sufficient redundant space such that it is impossible or nearly impossible to exceed the drive's rated maximum total write count. However, such an "over-engineered" approach not only wastes storage resources and increases cost, it is also becoming more difficult to achieve in a commercially reasonable way given the continuous rate of flash memory integration and die shrink resulting in a corresponding reduction in a flash device's total lifetime write count.

Advantageously, the techniques described herein may constantly adjust the wear rate such that one particular logical-to-physical size ratio may function in a variety of different applications requiring different wear rates. Consequently, in operation, the flash drives may experience wear in a more predictable and controlled manner, thereby reducing the likelihood that one (or more) particular SSD drives fails sooner than expected as a result of exceeding its specified maximum total write count. Alternatively, or in addition, the tiering mechanism 225, as described above, may migrate data from flash drives 250 to hard disk drives on other tiers, such as FC drives or SAS drives on tier 1 240 and/or to SATA drives 24a on tier 2 245. Similarly, in the case where a flash drives wear rate is below its specified wear rate, logical space allocation may be increased to provide more flash space for user data operations, thereby improving system performance.

The particular user or system policies applied to the tiering mechanism 225 and dynamic adjustment unit 255 may take into account the characteristics of the devices that comprise a tier. Data characteristics may also be considered, such as when knowledge of the data is available as may be the case when storage is provisioned to store particular types of data (e.g., email vs. database). For instance, in the example above with a first tier of SLC devices and a second tier of MLC devices, a policy may be used that takes into account the potential that SSDs servicing write-heavy applications may fail more quickly than SSDs servicing read-heavy applications. Thus, the rate of wear may be adjusted to take into account the data activity directed to the SSD and the logical space may be allocated according. Such determination and adjustment may be upon initial drive configuration and/or during operation. It should be noted that the techniques described herein may be used in conjunction with SSDs based on a number of different interface types, such as PCIe, SAS, SATA, FC and the like.

Figure 3:
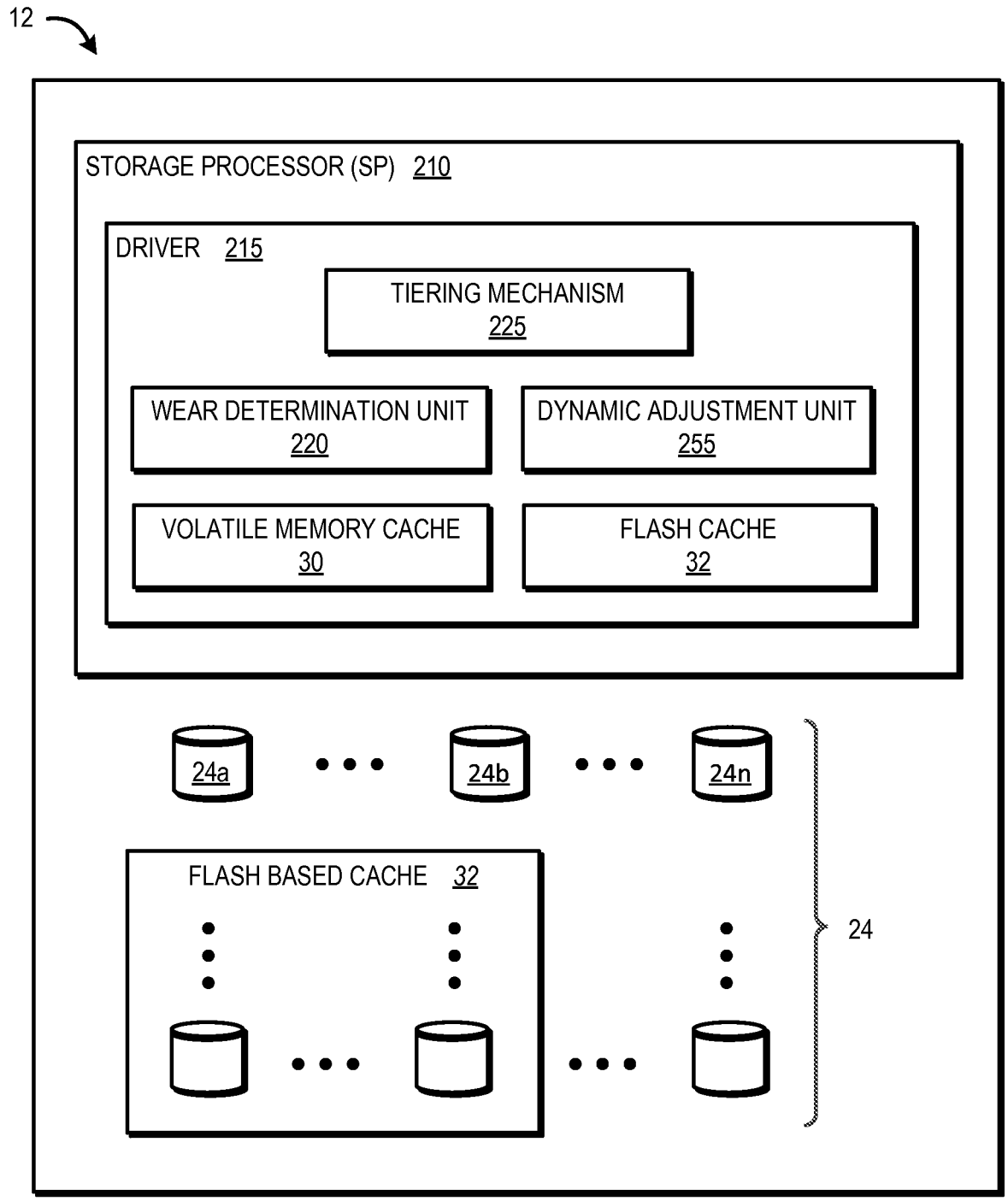
FIG. 3 is a block diagram illustrating an example embodiment in additional detail that may utilize the techniques described herein.

Referring to FIG. 3, shown is a more detailed representation of components that may be included in an example embodiment using the techniques described herein. In this embodiment, the tiering, wear determination, and dynamic adjustment techniques described herein may be applied in a similar manner to a flash based caching operations. That is, data in a flash cache having multiple flash drives may be managed in a manner whereby logical space and/or over-provisioning space may be statically or dynamically increased or decreased to adjust the wear rate of SSDs configured as flash cache to improve the likelihood the SSDs will last at least as long as intended while providing maximum performance based on an SSDs particular design parameters.

In this example embodiment, a data storage system 12 may include disks 24 accessed by logical volumes or pools as described above. The data storage system 12 may also include a storage processor 210 having a driver 215 that operates in accordance with and/or helps implement a wear determination unit 220, tiering mechanism 225, dynamic adjustment unit 255, volatile memory cache 30 and flash based cache 32.

The volatile memory (VM) storage cache 30 may be any one or more different types of volatile memory, such as DRAM. The flash based cache 32 is a flash based memory or solid state drive (SSD) comprising multiple flash drives. The data storage system 12 may utilize a caching technique in which data for a request is written to, or read from, VM cache 30. The VM cache 30 is used to designate some portion of VM used as a cache although there may be other VM included in the data storage system for other purposes. During normal operations, data from the VM cache 30 may be stored to a portion of the flash cache 32, and the data may be de-staged at a later point from the flash cache 32 to disk 24, and data may be read from disk 24 into a portion of flash cache 32 and/or VM cache 30.

The driver 215 may be configured to perform data storage operations on behalf of the hosts of FIG. 1 during normal operation using the volatile memory storage cache 30, the flash based cache 32, and the disks 24. During normal operation in the case of a write request, when a host sends a request to write data to the data storage system, the driver 215 stores the data of the write request in the VM cache 30 or flash cache 32. At some point later, the data is de-staged or written out to the disks 24 from the VM cache 30 or flash cache 32. During normal operation, in the case of a read request, when a host sends a request to read data from the data storage system, the driver 215 reads the data of the read request from the VM cache 30 or flash cache 32 if such data is available there.

Flash drives may be used as flash cache to extend the storage system's existing caching capacity to improve overall system-wide performance. Example embodiments may enable this by extending the functionality of DRAM cache by mapping frequently accessed data to flash drives 32 configured as flash based cache. Alternative example embodiments may include arranging flash cache into a particular configuration wherein the flash cache comprises SLC and MLC flash devices. The SLC and MLC flash devices may be further arranged into different categories based on, for example, endurance, speed, particular applications (e.g., read-heavy vs. write-heavy data operation), and the like.

Flash drives configured as flash cache may employ techniques described herein to reduce wear rate of the flash drives. In one example embodiment, the dynamic adjustment unit 255 may be configured to dynamically adjust the logical space allocated for flash based cache 32. If the wear determination unit 220 determines that the current wear rate for the flash based cache 32 exceeds a particular value, such as its specified wear rate, the dynamic adjustment unit 255 may dynamically reduce the amount of allocated logical space in the flash based cache 32 such that less data will be written to the flash based cache 32. Because the amount of data being written to the flash based cache 32 decreases, the wear rate of the flash based cache 32 decreases as well. Conversely, the dynamic adjustment unit 255 may be configured to increase the amount of allocated logical space in the flash based cache 32, thereby increasing the amount of cache available which can improve overall system-wide performance.

As a result, the wear rate may effectively be dynamically adjusted in that the logical space may be decreased to slow the wear rate or increased to increase the amount of flash based cache 32 available for storage operations. The wear rate may be increased to provide additional storage and/or performance benefits if it is determined that the current wear rate is below the specified wear rate. Accordingly, the wear rate may be continuously monitored and dynamically adjusted by increasing or decreasing the flash based cache's 32 logical space and/or over-provisioning space as often as desired or necessary.

Alternative embodiments may further include configuring the driver 215 and/or components therein, to perform one or more additional steps or actions to enable the DSS 12 to adapt to the changing logical capacity of the flash based cache 32. For example, if logical capacity is decreased, any valid/dirty data to the data storage devices may be flushed and LBAs associated with the decreased capacity may be marked as or otherwise made unavailable. Conversely, if logical capacity is increased, LBAs in the cache associated with the newly made available capacity are marked as or otherwise made available for storage.

Figure 4:
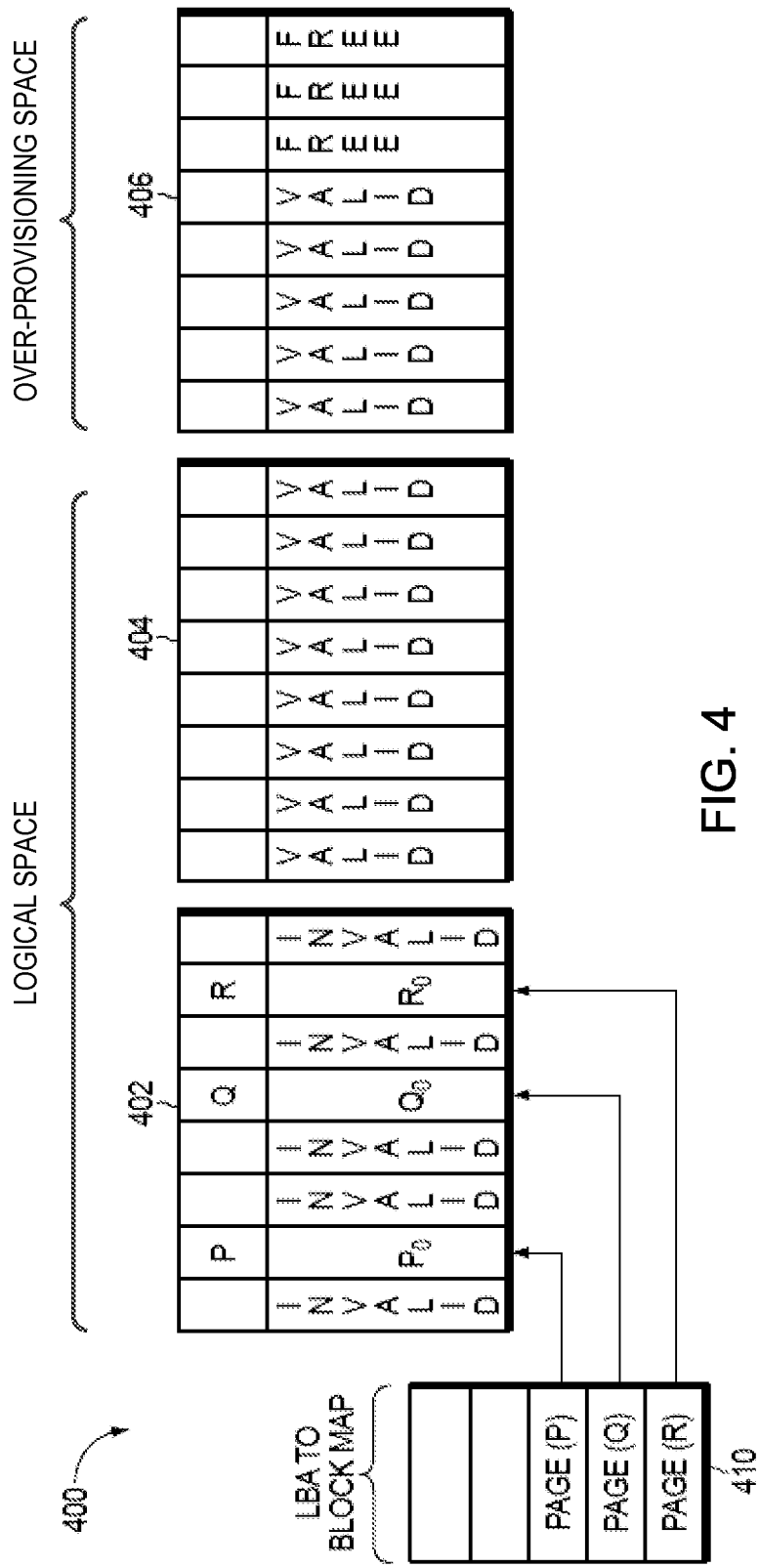
FIG. 4 is an example of a solid state drive (SSD) flash cache organized into blocks for storing data.

FIG. 4 depicts a solid state drive (SSD) 400 such as a NAND based flash device organized into blocks (402, 404, 406) for storing data. The blocks may be further subdivided and allocated as logical space blocks 402, 404 and over-provisioning space blocks 406. There is also illustrated a translation layer represented by a map 410 which can be referenced such that data content can be located at a specific location in the blocks (402, 404, 406). It should be understood from the figure that data content $P_0$, $Q_0$ and $R_0$ is located at pages P, Q, and R, respectfully, in the first block 402. However, there is also invalid data at locations in the first block 402 which have no pointer thereto. In other words, the locations comprise data that is not erased but not used either. It should be understood that the second block 404 comprises valid data with pointers (not shown) from the map to the specific locations. The pointers have been omitted for ease of illustration in this figure. It should also be understood that the third block 406 comprises blocks allocated for over-provisioning space and may be used for garbage collection tasks and other housekeeping duties as described herein.

A flash cache may be implemented using one or more SSDs within a data storage system according to techniques described herein. As alluded to above, flash memory is commonly referred to as 'write-once' technology because data cannot be written over directly. Rather, new data writes need to be written to a different page. The old data is marked invalid and indicated as erasable. As the flash cache is exercised, a block may become fragmented in that it may contain multiple valid and invalid pages. A block erase it is necessary to recoup the space previously consumed by pages that have been invalidated. However a block may also include valid pages, thus, it is necessary to copy any valid pages to a different block before erasing the block. The process of copying valid data to a new block prior to block erasure may be referred to as garbage collection.

For example, to recoup invalid pages in block 402, it is necessary to erase the pages first. However, it is not possible to overwrite or erase an individual page $P_0$, $Q_0$, and $R_0$. Rather, it is necessary to erase an entire block such that new data can be written to the block. Thus, if data is to be written from another location to one or more pages in the first block 402, it will be necessary to erase the entire block 402 as it will not be possible to overwrite data in the pages of the first block 402 of the flash device. To enable the new data to be written to the block 402, the valid data P0, Q0 and R0 in the first block 402 is written to free locations in the over-provisioning block 406. Furthermore, the map will be updated such that the pointers point to the new locations in the third block 406 (not shown). This enables the data in the first block 402 to be invalidated and the entire block 402 will be erased after which new data can be written to the newly freed pages in the block 402.

A data storage system implementing flash device storage technology may have multiple layers controlling various data management functions within the storage system. For example, there may be an SSD layer configured to manage data storage related operations associated with the SSD and a cache layer configured to manage data storage related operations associated with storage system cache.

The SSD layer is responsible for maintaining a map of LBAs for data that is stored in the SSD's flash. Pages are used to represent ranges of LBA's, and as noted herein, groups of pages may also be referred to as blocks. The states of these pages include: erased/free, valid, and invalid. The erased/free state represents pages that have been cleared and are available to be written to. The valid state represents a page that has been written to and contains the latest data for the associated LBA range. The invalid state indicates that a page was written to, but a more recent write of data to the same LBA range has occurred and has been placed in another page. Consequently, this page no longer represents information that will be retrieved by a user. A page will remain in this state until the block that contains the page is erased.

The cache layer maintains a map of pages of LBA ranges for data that is stored in the cache. The states of these pages include: invalid/free, valid/clean, and valid/dirty. In the cache layer, there is no different between invalid/free, like there is in the SSD layer. This state represents a page that does not contain any mapped data. The valid/clean state is used to represent a page that is stored in the cache, but there is another copy of this same information in the datastore. The valid/dirty state is used to represent a page that is stored in the cache, but has more recent data than what is in the datastore.

As referenced herein, the lifecycle of a cache page may be described as follows. In an example embodiment, some data D is retrieved from the datastore at a host LBA Y and placed in the cache which, in this example, causes a write of that data to cache LBA X in an SSD. The cache layer will now have an entry in its map that associates host LBA Y to internal Page P. At the cache layer, the map will contain a pointer to SSD LBA X. This entry will be set to Valid/Clean because there is another copy of the same information in the datastore.

The SSD layer will also have a corresponding entry in a table that associates LBA X to a page of flash memory that contains the data P0. This entry will be marked Valid. Now the host writes an update to page P. This will not cause the cache map to change, but will cause the state to change to Valid/Dirty. It also will cause a new write of data to LBA X to the SSD.

At this point, the SSD looks for a free page to write the new data for LBA X. If no free pages are available, a garbage collection cycle (as described herein) will be performed to make the necessary free pages available. Since the data cannot be stored until this step is performed, and the operation must wait for this step to complete, it can affect system operating performance as well as flash lifetime. This process may be referred to herein as a foreground garbage collection cycle. Once the new data is stored, the map is updated to associate LBA X with the new flash location, and the old page location is marked as invalid.

To avoid foreground garbage collection operations, an SSD may choose to run it proactively as a background operation. However, the SSD removes pages that it knows have been invalidated by over-writes. All other pages will be continuously copied to new blocks as the process cycles through all of the flash blocks in the SSD.

The cache layer may independently clean this cache page by updating the datastore with the information in the cache by reading SSD LBA X, writing it to the datastore, and then updating its page state to Valid/Clean. Consequently, changes are not necessary at the SSD level. At the SSD (flash) level, if the flash block that the page that LBA X points to is garbage collected (due to other invalid pages in that block), then, because this page is still considered valid, it will be copied to a new block and its pointers updated.

Within the cache layer, the pages may be arranged according to a particular priority scheme in order to determine which pages to keep in the cache, and which can be discarded when new data needs to be brought into the cache. A variety of cache policy management algorithms for page replacement and cache eviction may be used to populate the cache memory, such as, for example, a least recently used (LRU) (e.g., LRU-K or LRU-2), least frequently used (LFU), least recently/frequently-used (LRFU), adaptive replacement cache (ARC), multiqueue (MQ) replacement, 2Q, low inter-reference recency set (LIRS), and other similar algorithms.

For example, with the LRU algorithm, the cache manager will remove or replace the "least-recently-used" data element in the cache memory. The LRU data element is the usually the oldest data element accessed by a host computer. In order to identify the LRU data element, the cache manager maintains a list or queue of the data elements in the cache memory. The queue is typically implemented as a doubly-linked list. "Forward" and "backward" pointers for this doubly-linked list, for example, are in the cache directory entries, or in the blocks or slots in the cache. When a data element is accessed, the data element is moved to the tail of the queue unless the data element is already at the tail of the queue. If the data element is already in the cache but it is not already at the tail of the queue, it is removed from the queue before being inserted at the tail of the queue. In this fashion, so long as the queue is not empty, the LRU data element in the cache memory will be at the head of the queue, and the most-recently-used data element in the cache memory will be at the tail of the queue.

Figure 5:
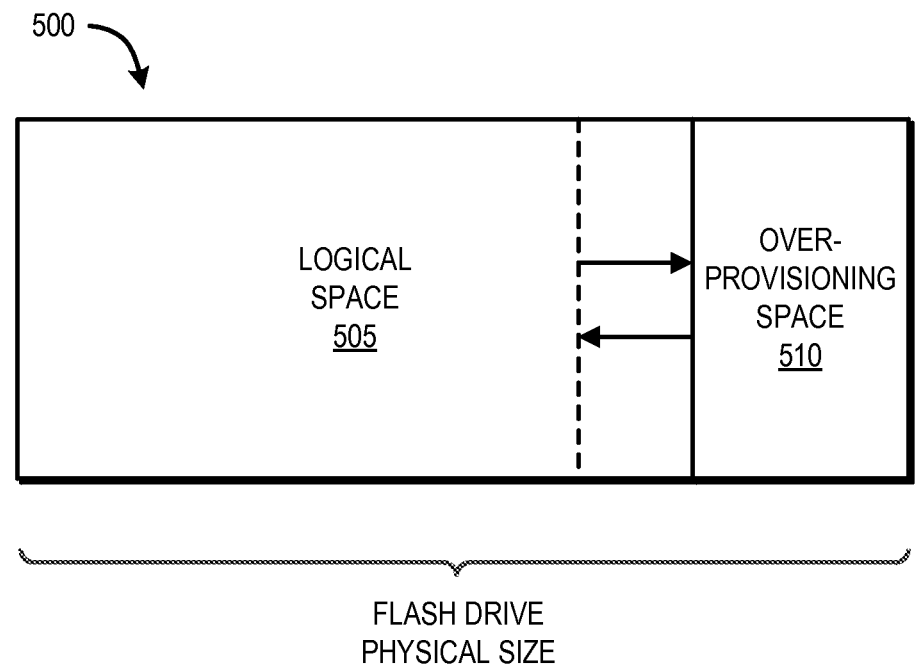
FIG. 5 is a block diagram illustrating an example embodiment that may utilize the techniques described herein.

Referring to FIG. 5, there is illustrated an SSD 500 having a physical size partitioned or allocated into logical space 505 and over-provisioning space 510. SSDs are configured with a particular logical space 505 to over-provisioning space 510 ratio that is fixed by the SSD manufacturer. The ratio of logical space 505 to over-provisioning space 510 can affect the amount write amplification that may be performed by the SSD during garbage collection. For example, a low ratio of over-provisioning space 510 relative to the amount of logical space 505 may cause a high rate of write amplification whereas a high ratio (i.e., larger amount of over-provisioning space 510 relative to logical space 505) may cause a lower rate of write amplification.

The particular ratio may be selected based on the intended end use. For example, consumer applications may select SSDS having a low ratio of over-provisioning space 510 to logical space 505. A low ratio will provide more logical space 505 for user storage against a tradeoff of increased write amplification and reduced system performance. Such a configuration will provide a lower cost per unit storage which may be more desirable for cost sensitive consumer applications. Enterprise applications may chose a higher over-provisioning to logical space ratio to reduce write amplification and increase system performance against a tradeoff of reduced logical space 505. In this case, performance and reliability may be improved but at a higher cost per unit of storage. However, in either case, with conventional systems, the chosen SSD over-provisioning ratio is fixed and cannot be adjusted.

When selecting a particular ratio, the write rate may be considered such that the chosen ratio will allow a certain number of erase operations at a certain rate over time to provide an expected lifetime operation that may be used, for example, in determining durability and warranty policies. However, if the ration is underestimated and/or the end use experiences more write operations that expected, the SSD may fail sooner than anticipated, resulting in unsatisfied customers and increased maintenance costs.

In an example embodiment, employing techniques described herein provide for the ability to increase and/or decrease the logical space 505 to over-provisioning space 510 ratio, thereby allowing the write rate to be dynamically increased and/or decreased providing the ability to adjust wear rates and improve system performance. Consequently, the flash drives experience wear in a more predictable and controlled manner, thereby reducing the likelihood that an SSD drive will fail sooner than expected as a result of exceeding its designed maximum write count specification.

For example, in operation, an SSD may be monitored to determine its wear rate over time. The determined wear rate may be compared to the SSD's specified wear rate. If it is determined that the current wear rate is higher than the specified wear rate, the amount of logical space 505 may be decreased (as shown by the dotted line in FIG. 5). As a result, the amount of data written to the SSD decreases, thereby reducing the wear rate. In addition, the logical space no longer accessible (i.e., the difference between the logical space before and after being decreased) may be made available for over-provisioning space 510 thereby improving garbage collection efficiency.

On the other hand, if while monitoring the SSD it is determined that the wear rate is below the specified wear rate, the amount of logical space may be increased. Such an increase will provide more user storage and may also improve system performance. Such ability to dynamically decrease and increase logical space allows optimizing the wear rate to achieve maximum SSD performance while ensuring wear specifications are achieved.

Alternatively, or in addition, example embodiments include adjusting an allocation ratio by increasing and/or decreasing the amount of over-provisioning space 510. Such an embodiment may include selecting an SSD with very little or no over-provisioning space 510. The SSD 500 may then be configured initially as having a particular over-provisioning space 510 as determined by the user or system (e.g., 20%). During operation, the SSD's wear rate may be dynamically decreased to slow its wear rate to extend the SSD expect lifetime operation, or increased to provide additional logical space for improved system performance in a manner at that described above. As such, the over-provisioning space may be essentially completely adjustable using the techniques described herein rather than up to the fixed value as provided by the SSD manufacturer.

In other alternative example embodiments, an SSD may be selected having less space that a particular wear profile would call for. In such a case, the logical space 505 may be decreased then made available for use as over-provisioning space 510 such that the ratio of over-provisioning space 510 to logical space 505 may be dynamically adjusted to achieve particular wear profile. In other words, the logical space 505 may be subdivided into a first space for use as logical space and a second space for use as additional over-provisioning space. In this embodiment, a larger logical space 505 may be provided in the event it is desirable to provide additional logical space 505. Accordingly, the ratio of logical space 505 to over-provisioning space 510 may be adjusted by increasing/decreasing logical space 505 and/or decreasing/increasing over-provisioning space 510.

Figure 6:
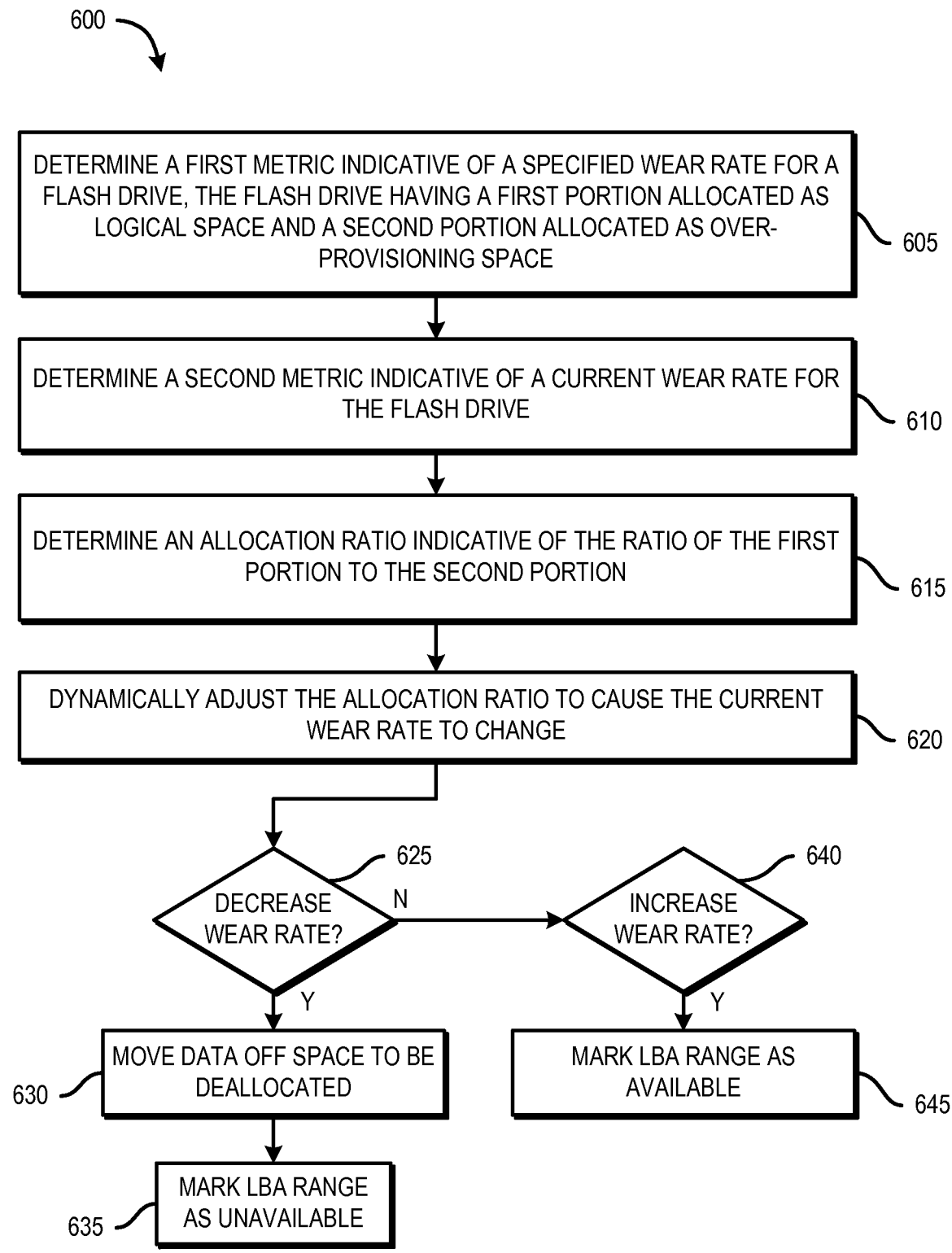
FIG. 6 is a flowchart of the technique performed by the data storage system of FIG. 1.

Referring to FIG. 6, there is illustrated a flow diagram of an exemplary method 600 according to various implementations for use in managing data storage in a data storage system. While various methods disclosed herein are shown in relation to a flowchart or flowcharts, it should be noted that any ordering of method steps implied by such flowcharts or the description thereof is not to be construed as limiting the method to performing the steps, or sub-steps within or among the steps, in that order. Rather, the various steps of each of the methods disclosed herein can be performed in any of a variety of sequences. In addition, as the illustrated flowcharts are merely example embodiments, various other methods that include additional steps or include fewer steps than illustrated are also within the scope of the present invention. The operations may be performed in hardware, or as processor-executable instructions that may be executed by a processor. Furthermore, the method 600 may, but need not necessarily, be implemented using the data storage system of FIG. 1 and may also be implemented, in or in combination with, for example, a server, storage appliance, network device, cloud storage system, software defined storage, or other such implementation comprising flash devices. The flash devices may be constructed using different types of memory technologies such as nonvolatile semiconductor NAND flash memory forming one or more SLC devices and/or MLC devices. The flash drive may be configured as cache in a data storage system. Alternatively, or in addition, flash drives may be configured as a storage tier in the data storage system, wherein the storage tier is one of multiple storage tiers, the multiple storage tiers having progressively better response time characteristics.

At step 605, the method determines a first metric indicative of a specified wear rate for a flash drive, the flash drive having a first portion allocated as logical space and a second portion allocated as over-provisioning space. The specified wear rate may be the manufacturer's specified write durability (e.g., number of lifetime P/E cycles) and may be stored in the system or SSD and may be obtained my issuing a command to the SSD or flash drive.

At step 610, the method determines a second metric indicative of a current wear rate for the flash drive. The current wear rate may be determined by issuing a command to the SSD to determine its current write count and time installed or in operation and calculating the number of writes per unit time. The specified wear rate and the current wear rate may be represented as a write count or erasure count over a period of time.

At step 615, the method may determine an allocation ratio indicative of the ratio of the logical space to over-provisioning space. For example, the method may issue a command to obtain the current setting for each such that the current allocation ration may be calculated.

At step 620, the method may dynamically adjust the allocation ratio of the flash drive to cause the current wear rate to change. Adjusting the allocation ratio may include decreasing the logical space or decreasing the logical space and increasing the over-provisioning space by an amount up to the amount at which the logical space was decreased. Alternatively, adjusting the allocation ratio may include increasing the logical space or increasing the logical space and decreasing the over-provisioning space by an amount up to the amount at which the logical space was increased.

At step 625, a determination is made as to whether the wear rate is to be decreased, and if so, the method may proceed to step 630 where a sub-portion of the logical space is identified for deallocation. Any data stored on the sub-portion may be migrated off the sub-portion to, for example, other flash drives or other storage units on other tiers in the DSS such as the tier as shown in FIG. 2 and text related thereto. The sub-portion selected for deallocation may be chosen based on any appropriate criteria and identified using, for example, a range of logical block addresses (LBAs). The LBAs may be contiguous or segmented across the logical space in a variety of patterns. Other such identifiers capable of identifying physical or logical locations within the flash drive may be similarly implemented. At step 635, the sub-portion may then be marked or otherwise designated as unavailable for subsequent data storage.

In an embodiment where flash drives are configured as DSS cache, the method may include enabling the DSS 12 to adapt to the changing logical capacity of the flash based cache 32. For example, if logical capacity is decreased, any valid/dirty data to the data storage devices may be flushed and LBAs associated with the decreased capacity may be marked as or otherwise made unavailable. Conversely, if logical capacity is increased, LBAs in the cache associated with the newly made available capacity are marked as or otherwise made available for storage.

If, at step 625, a determination is made wherein the wear rate is not decreased, the method proceeds to step 640 to determine if the wear rate is to be increased. If not, the method may stop, or be repeated as desired or necessary (not shown). If wear rate is to be increased, the method proceeds to step 645 where logical space is reallocated or otherwise may available for subsequent storage operations. For example, the logical space may have been previously deallocated during a previous wear rate decrease, or originally configured with a sub-portion of the logical space marked as unavailable. In these cases, the deallocated sub-portion may be reallocated by, for example, marking LBAs associated with the sub-portion as available so that future write operations may take advantage of the additional logical space. The allocation ratio may be recalculated for use by the DSS to create reports, update user interfaces, and for use in subsequent wear rate determination. Alternatively, or in addition, the method may be modified and applied to over-provisioning space whereby the over-provisioning space may be increased or decreased in a similar manner. Thus, the current wear rate may be increased by increasing the logical space and/or decreasing the over-provisioning space.

The allocation ratio may be dynamically adjusted up or down at a rate so as to adjust the flash drive's wear rate as often as desired or necessary. For example, the rate may be adjusted hourly, daily, monthly, or other such time unit. Other system parameters may be similarly used, such as application based, event based, load based, and the like. The method may further include issuing a report indicative of the allocation ratio or current wear rate. For example, allocation ratio and/or current wear rate may be provided to other software and/or hardware components of the data storage system.

The method, system, and computer program product may issue a command to indicate a change in the amount of space allocated for the logical space, such as a TRIM command. The TRIM command may be directed to the SSD with logical addresses such that the logical space will be marked as unavailable. Alternatively, the space marked as unavailable may be allocated to over-provisioning space thereby increasing the over-provisioning space (and consequently, the ratio of logical to over-provisioning space).

While the above description describes the use of a SATA TRIM command to indicate to the solid state drive that the data for a range of LBAs is no longer available, it should be appreciated that the technique can use other commands when using other interfaces to the SSD. For example, for a SCSI based solid state drive, a standard interface that can provide a similar function is the SCSI "UNMAP" command.

While the above description refers to SAN attached storage, it should be appreciated that the technique can also apply to NAS attached storage. For example, when applied to NAS attached storage the data movement can be at the block level as described or the temperature can be tracked at and the data movement can be implemented at the file level. Additionally, it should be appreciated that the technique can apply to either block, file object and/or content based cache implementations that use FLASH based storage.

It will be appreciated that an embodiment may implement the technique herein using code executed by a computer processor. For example, an embodiment may implement the technique herein using code which is executed by a processor of the data storage system. As will be appreciated by those skilled in the art, the code may be stored on the data storage system on any one of a computer-readable medium having any one of a variety of different forms including volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, (DVD) or other optical storage, magnetic cassettes, magnetic tape, magnetic disk storage or other magnetic storage devices, or any other medium which can be used to store the desired information and which can accessed by a data storage system processor.

While various embodiments of the present disclosure have been particularly shown and described, it will be understood by those skilled in the art that various changes in form and details may be made therein without departing from the spirit and scope of the present disclosure as defined by the appended claims.

What is claimed is:

1. A method for use in managing data storage in a data storage system, the method comprising:

determining, in a data storage system having a plurality of physical flash drives, a first specified wear rate for a first individual physical flash drive, the first flash drive having a physical storage size divided into a first portion and a second portion, wherein the first portion is allocated as logical space reserved for storing user data and the second portion is allocated as over-provisioning space reserved for data management processes internal to the first flash drive, wherein the size of the first portion and the second portion are dynamically adjustable based, at least in part, on data storage system workload changes associated with user data stored in the first portion;

determining a current wear rate for the first flash drive after the first specified wear rate, wherein the first specified wear rate and the current wear rate are each derived from a write count or an erasure count;

determining an allocation ratio indicative of a ratio of the first portion to the second portion; and dynamically adjusting the allocation ratio to cause the current wear rate to approximate the first specified wear rate.

2. The method as claimed in claim 1, wherein dynamically adjusting the allocation ratio includes decreasing the logical space.

3. The method as claimed in claim 1, wherein dynamically adjusting the allocation ratio includes:

identifying a first sub-portion of the first portion, wherein the first sub-portion is targeted for deallocation;

migrating data stored in the first sub-portion of the first portion off the first sub-portion; and designating the sub-portion of the first portion as unavailable for subsequent data storage.

4. The method as claimed in claim 1, wherein dynamically adjusting the allocation ratio includes increasing the logical space.

5. The method as claimed in claim 1, wherein dynamically adjusting the allocation ratio includes:

identifying a first sub-portion of the first portion, wherein the first sub-portion is targeted for reallocation; and designating the sub-portion as available subsequent data storage.

6. The method as claimed in claim 1, wherein dynamically adjusting the allocation ratio includes increasing or decreasing the second portion.

7. The method as claimed in claim 1, wherein dynamically adjusting the allocation ratio includes issuing a TRIM command, small computer system interface (SCSI) command, flash command, cache command or storage system command.

8. The method as claimed in claim 1, wherein the first flash drive is configured as data storage system cache.

9. The method as claimed in claim 1, further including issuing a report indicative of the allocation ratio or current wear rate.

10. A system for use in managing data storage in a data storage system, the system configured to:

determine, in a data storage system having a plurality of physical flash drives, a first specified wear rate for a first individual physical flash drive, the first flash drive having a physical storage size divided into a first portion and a second portion, wherein the first portion is allocated as logical space reserved for storing user data and the second portion is allocated as over-provisioning space reserved for data management processes internal to the first flash drive, wherein the size of the first portion and the second portion are dynamically adjustable based, at least in part, on data storage system workload changes associated with user data stored in the first portion;

determine, by a wear determination unit, a current wear rate for the first flash drive after the first specified wear rate, wherein the first specified wear rate and the current wear rate are each derived from a write count or an erasure count;

determine, by the wear determination unit, an allocation ratio indicative of a ratio of the first portion to the second portion; and dynamically adjust, by a dynamic adjustment unit, the allocation ratio to cause the current wear rate to approximate the first specified wear rate.

11. The system as claimed in claim 10, wherein the dynamic adjustment unit is configured to dynamically decrease the logical space.

12. The system as claimed in claim 10, wherein the dynamic adjustment unit is configured to dynamically decrease the logical space and increase the over-provisioning space by a corresponding amount.

13. The system as claimed in claim 10, wherein the dynamic adjustment unit is configured to increase the logical space.

14. The system as claimed in claim 10, wherein the dynamic adjustment unit is configured to increase the logical space and decrease the over-provisioning space by a corresponding amount.

15. The system as claimed in claim 10, wherein the dynamic adjustment unit is configured to dynamically increase or decrease the over-provisioning space size.

16. The system as claimed in claim 10, wherein the dynamic adjustment unit is configured to dynamically adjust the allocation ratio includes issuing a TRIM command, small computer system interface (SCSI) command, flash command, cache command or storage system command.

17. The system as claimed in claim 10, wherein the first flash drive is configured as data storage system cache.

18. A computer-program product including a non-transitory computer-readable storage medium encoded with computer-program code that, when executed on a processor of a computer, causes the computer to manage data storage in a data storage system by:

determining, in a data storage system having a plurality of physical flash drives, a first specified wear rate for a first individual physical flash drive, the first flash drive having a physical storage size divided into a first portion and a second portion, wherein the first portion is allocated as logical space reserved for storing user data and the second portion is allocated as over-provisioning space reserved for data management processes internal to the first flash drive, wherein the size of the first portion and the second portion are dynamically adjustable based, at least in part, on data storage system workload changes associated with user data stored in the first portion;

determining a current wear rate for the first flash drive after the first specified wear rate, wherein the first specified wear rate and the current wear rate are each derived from a write count or an erasure count;

determining an allocation ratio indicative of a ratio of the first portion to the second portion; and dynamically adjusting the allocation ratio to cause the current wear rate to approximate the first specified wear rate.

\* \* \* \* \*